US005825673A

United States Patent [19]
Watanabe

[11] Patent Number: 5,825,673
[45] Date of Patent: Oct. 20, 1998

[54] DEVICE, METHOD, AND SOFTWARE PRODUCTS FOR EXTRACTING CIRCUIT-SIMULATION PARAMETERS

[75] Inventor: Hirofumi Watanabe, Miki, Japan

[73] Assignee: Ricoh Company, Ltd., Tokyo, Japan

[21] Appl. No.: 756,572

[22] Filed: Nov. 26, 1996

[30] Foreign Application Priority Data

Nov. 28, 1995 [JP] Japan .................................. 7-309327

[51] Int. Cl.⁶ .................................................. G06F 17/50
[52] U.S. Cl. ........................................ 364/578; 364/488
[58] Field of Search .................................. 364/488, 489, 364/490, 578

[56] References Cited

U.S. PATENT DOCUMENTS

| | | | |
|---|---|---|---|
| 5,247,468 | 9/1993 | Henrichs et al. | 364/578 |
| 5,349,539 | 9/1994 | Moriyasu | 364/578 |
| 5,379,232 | 1/1995 | Komoda | 364/489 |
| 5,394,346 | 2/1995 | Milsom | 364/578 |
| 5,404,310 | 4/1995 | Mitsuhashi | 364/490 |
| 5,490,095 | 2/1996 | Shimada et al. | 364/578 |
| 5,517,421 | 5/1996 | Jimbo et al. | 364/491 |
| 5,648,920 | 7/1997 | Duvvury et al. | 364/578 |

OTHER PUBLICATIONS

Bing J. Sheu, et al., "BSIM: Berkeley Short–Channel IGFET Model for MOS Transistors," IEEE Journal of Solid–State Circuits, vol. sc–22, No. 4 (Aug. 1987).

*Primary Examiner*—Vincent N. Trans
*Attorney, Agent, or Firm*—Cooper & Dunham LLP

[57] ABSTRACT

A device for conducting circuit simulation of circuits includes a process calculating unit for calculating device structures of circuit component devices, a device calculating unit for calculating device characteristics based on the device structures, a first circuit calculating unit for calculating first dynamic characteristics of a sample circuit including the circuit component devices based on the device characteristics, a second circuit calculating unit for calculating second dynamic characteristics of the sample circuit based on first parameters and second parameters, and a parameter extracting unit for extracting the first parameters based on the device structures and the device characteristics and for determining the second parameters such that the first dynamic characteristics and the second dynamic characteristics are substantially matched. The second circuit calculating unit conducts the circuit simulation of the circuits based on the first parameters and the second parameters.

28 Claims, 9 Drawing Sheets

FIG. 4A

|        | $V_{DS1}$ | $V_{DS2}$ | $V_{DS3}$ | $V_{DS4}$ | ... |
|--------|-----------|-----------|-----------|-----------|-----|
| $V_{BS1}$ |           |           |           |           |     |
| $V_{GS1}$ | $I_{DS1}$ | $I_{DS2}$ | $I_{DS3}$ | .         | ... |
| $V_{GS2}$ | .         | .         | .         | .         |     |
| $V_{GS3}$ | .         | .         | .         | .         |     |
| $V_{GS4}$ | .         | .         | .         | .         |     |
| ⋮      | ⋮         | ⋮         | ⋮         | ⋮         |     |

(with $V_{BS2}$, $V_{BS3}$ ... as additional sheets)

FIG. 4B

|        | $V_{GS1}$ | $V_{GS2}$ | $V_{GS3}$ | $V_{GS4}$ | ... |
|--------|-----------|-----------|-----------|-----------|-----|
| $V_{DS1}$ | $C_{gs1}$ | $C_{gs2}$ | $C_{gs3}$ | $C_{gs4}$ | ... |
| $V_{DS2}$ | .         | .         | .         | .         |     |
| $V_{DS3}$ | .         | .         | .         | .         |     |
| $V_{DS4}$ | .         | .         | .         | .         |     |
| ⋮      | ⋮         | ⋮         | ⋮         | ⋮         |     |

FIG. 4C

|        | $V_{GS1}$ | $V_{GS2}$ | $V_{GS3}$ | $V_{GS4}$ | ... |
|--------|-----------|-----------|-----------|-----------|-----|
| $V_{DS1}$ | $C_{gb1}$ | $C_{gb2}$ | $C_{gb3}$ | $C_{gb4}$ | ... |
| $V_{DS2}$ | .         | .         | .         | .         |     |
| $V_{DS3}$ | .         | .         | .         | .         |     |
| $V_{DS4}$ | .         | .         | .         | .         |     |
| ⋮      | ⋮         | ⋮         | ⋮         | ⋮         |     |

FIG. 4D

|        | $V_{GS1}$ | $V_{GS2}$ | $V_{GS3}$ | $V_{GS4}$ | ... |
|--------|-----------|-----------|-----------|-----------|-----|
| $V_{DS1}$ | $C_{gd1}$ | $C_{gd2}$ | $C_{gd3}$ | $C_{gd4}$ | ... |
| $V_{DS2}$ | .         | .         | .         | .         |     |
| $V_{DS3}$ | .         | .         | .         | .         |     |
| $V_{DS4}$ | .         | .         | .         | .         |     |
| ⋮      | ⋮         | ⋮         | ⋮         | ⋮         |     |

|  | Tpd | Idsat |
|---|---|---|
| MEASURED | 388psec | 283 $\mu$A |
| DATA-TABLE-BASED SIMULATION | 380psec | 283 $\mu$A |

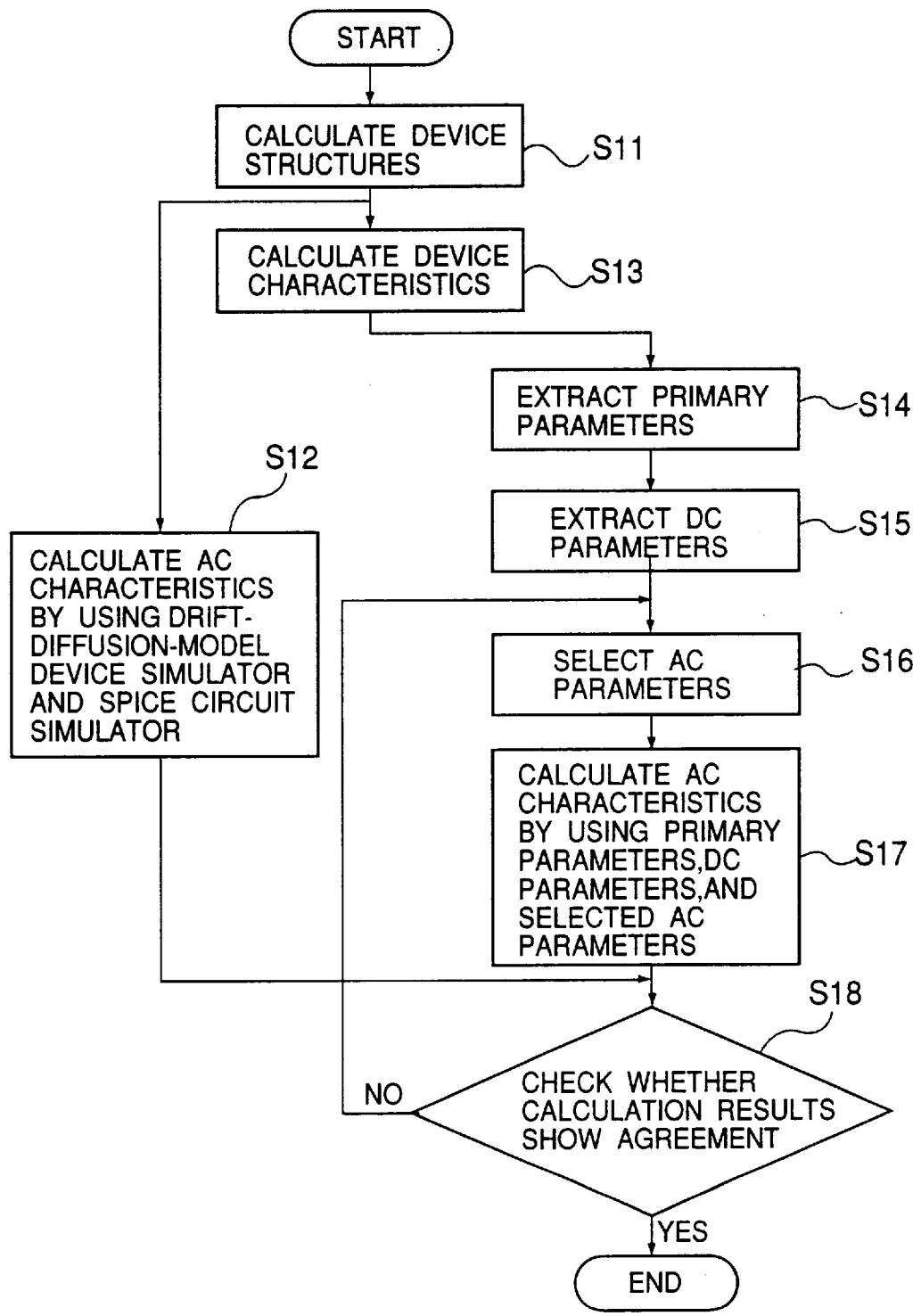

DEVICE, METHOD, AND SOFTWARE PRODUCTS FOR EXTRACTING CIRCUIT-SIMULATION PARAMETERS

BACKGROUND OF THE INVENTION

1. Field of the Invention

The present invention generally relates to integrated simulation devices and circuit-parameter-extraction methods, and particularly relates to simulation-parameter extraction for SPICE (simulation program with IC emphasis) which is used in designing integrated circuits comprised of MOS transistors.

2. Description of the Related Art

In general, a SPICE simulator simulates dynamic characteristics of a circuit based on MOS-transistor static characteristics represented by an analytic model, dynamic characteristics of MOS-transistor circuit components, and connections between these circuit components. The static characteristics (hereinafter referred to as DC characteristics) are relevant when constant voltage is applied to MOS-transistor circuit components. The dynamic characteristics (hereinafter referred to as AC characteristics) relate to temporal variations in voltage and current of the MOS-transistor circuit components, and are essentially capacitance characteristics.

An analytic model for transistors has been developed at the University of California, Berkeley, and been made public (IEEE Journal of Solid-State Circuits, Vol. sc-22, No. 4, August 1987, a disclosure of which is hereby incorporated by reference). This analytic model is known as BSIM (Berkeley short-channel IGFET model for MOS transistors). The BSIM expresses DC characteristics of an electric current in a triode region ($V_{GS} > V_{th}$ and $0 < V_{DS} < V_{DSAT}$) as:

$$I_{DS} = \frac{\mu_0}{[1 + U_0(V_{GS} - V_{th})]} \cdot \frac{\frac{\epsilon}{Tox} \frac{W}{L}}{\left(1 + \frac{U_1}{L} V_{DS}\right)} \left( (V_{GS} - V_{th})V_{DS} - \frac{a}{2} V_{DS}^2 \right) \quad (1)$$

$$V_{th} = V_{FB} + \phi_S + K_1 \sqrt{\phi_S - V_{BS}} - K_2(\phi_S - V_{BS}) - \eta V_{DS} \quad (2)$$

wherein $V_{FB}$ is flat-band voltage, $\phi_s$ is surface-inversion potential, $K_1$ is a body-effect coefficient, $K_2$ is a source-and-drain-depletion-charge sharing coefficient, $\eta$ is a drain-induced-barrier lowering coefficient, $U_0$ is a vertical-field-mobility-degradation coefficient, $U_1$ is a velocity-saturation coefficient, and $\mu_0$ is carrier mobility. Also, $V_{GS}$ is gate-source voltage, $V_{DS}$ is drain-source voltage, $V_{th}$ is threshold voltage, $V_{DSAT}$ is drain-saturation voltage, $V_{BS}$ is bulk-source voltage, and "a" is a body-effect coefficient.

In the above equation, parameters $V_{FB}$, $\phi_s$, $K_1$, $K_2$, $\eta$, $U_0$, $U_1$, $\mu_0$, etc., can take any possible values.

Changes in process technology and device sizes necessitate the use of updated optimal parameters for accurately emulating transistor characteristics to achieve accurate circuit simulations. In this manner, parameters are critical and important factors in SPICE simulators.

In general, parameters prepared for a circuit simulation are obtained through various measurements of a sample circuit, which is specifically made for parameter-extraction purposes. This sample circuit is called a TEG (test element group) and is made by using an appropriate process technology.

A parameter extraction method will be explained with reference to FIG. 1. Parameters used in SPICE simulations are classified into three main categories. The first category includes primary parameters which can be obtained directly from measurement of the TEG. The second category includes DC parameters which accurately emulate DC characteristics of transistors of the TEG. The third category includes AC parameters which accurately emulate AC characteristics of the sample circuit of the TEG.

The primary parameters includes such parameters as resistances of polysilicon layers and diffusion layers. At a step S21 of FIG. 1, these primary parameters are obtained directly by measuring the TEG. At a step S22, DC characteristics of the transistor model (i.e., equation (1)) are compared with measured DC characteristics of the TEG transistors to obtain DC parameters which achieve matching between the measured DC characteristics and the modeled DC characteristics. For example, Tox is the primary parameter, and $V_{FB}$, $\phi_s$, $K_1$, $K_2$, $\eta$, $U_0$, $U_1$, and $\mu_0$ are the DC parameters in the above equations (1) and (2). At a step S23, AC characteristics of the sample circuit of the TEG are measured, and, then, are compared with AC characteristics calculated by circuit simulation using the above-identified DC parameters to obtain AC parameters which provide good agreement between the measured AC characteristics and the simulated AC characteristics. The sample circuit used here is typically a ring oscillator, for example, which allows easy measurement of AC characteristics such as power consumption and a delay time.

In this manner, the primary parameters, the DC parameters, and the AC parameters are obtained for transistor components. These parameters are used in a subsequent circuit simulation for the purpose of helping the circuit design process.

Recent development of simulation platforms such as workstations has resulted in more precise simulation technologies being available from process simulation, device simulation, to circuit simulation. As a result, a process simulation is used more often than before instead of actually producing devices, and a device simulation can now provide accurate estimates of device characteristics without actual measurement of produced devices. This removes the need for making sample circuits on wafers when extracting parameters used in circuit simulation.

However, a method of extracting parameters in a continuous work flow, as described above with reference to actual measurement of a sample circuit, is not yet established with respect to simulations. Currently, process simulation, device simulation, and circuit simulation are all used as separate tools in their respective fields. With an expectation to provide a better design environment, efforts have been directed to development of a method of combining these simulations as an integrated system.

Accordingly, there is a need for a method of extracting circuit-simulation parameters and an integrated simulation device based on this method which can extract the parameters from process simulation, device simulation, and circuit simulation.

SUMMARY OF THE INVENTION

Accordingly, it is an object of the present invention to provide a method of extracting circuit-simulation parameters and an integrated simulation device based on this method which can satisfy the need described above.

Also, it is another and more specific object of the present invention to provide a method of extracting circuit-simulation parameters and an integrated simulation device based on this method which can extract the parameters from process simulation, device simulation, and circuit simulation.

In order to achieve the above objects, a device for conducting circuit simulation of circuits includes a process calculating unit for calculating device structures of circuit component devices, a device calculating unit for calculating device characteristics based on the device structures, a first circuit calculating unit for calculating first dynamic characteristics of a sample circuit including the circuit component devices based on the device characteristics, a second circuit calculating unit for calculating second dynamic characteristics of the sample circuit based on first parameters and second parameters, and a parameter extracting unit for extracting the first parameters based on the device structures and the device characteristics and for determining the second parameters such that the first dynamic characteristics and the second dynamic characteristics are substantially matched. The second circuit calculating unit conducts the circuit simulation of the circuits based on the first parameters and the second parameters.

The above device conducts the process simulation, the device simulation, and the circuit simulation to extract parameters (first parameters and second parameters) necessary for a subsequent circuit simulation, wherein AC parameters (second parameters) are determined based on a comparison of dynamic characteristics between parameter-based analytic models and device-characteristics-based model simulations. Thus, the present invention can extract the parameters to be used in the subsequent circuit simulation without actually producing devices, measuring the devices, and testing a sample circuit.

The same objects are also achieved by a method of extracting parameters for conducting circuit simulation which includes the steps of calculating device structures of devices, calculating device characteristics based on the device structures, calculating first dynamic characteristics of a sample circuit including the devices based on the device characteristics, extracting first parameters based on the device structures and the device characteristics, determining second parameters, calculating second dynamic characteristics of the sample circuit based on the first parameters and the second parameters, and adjusting the second parameters such that the first dynamic characteristics and the second dynamic characteristics are substantially matched.

Further, the same objects are achieved by a computer program product for conducting circuit simulation of circuits which includes a computer readable medium providing program code means for extracting parameters to conduct the circuit simulation. The program code means includes process calculating means for causing a computer to calculate device structures of circuit component devices, device calculating means for causing the computer to calculate device characteristics based on the device structures, first circuit calculating means for causing the computer to calculate first dynamic characteristics of a sample circuit including the circuit component devices based on the device characteristics, second circuit calculating means for causing the computer to calculate second dynamic characteristics of the sample circuit based on first parameters and second parameters, and parameter extracting means for causing the computer to extract the first parameters based on the device structures and the device characteristics, and to determine the second parameters such that the first dynamic characteristics and the second dynamic characteristics are substantially matched, wherein the second circuit calculating means causes the computer to conduct the circuit simulation of the circuits based on the first parameters and the second parameters.

Other objects and further features of the present invention will be apparent from the following detailed description when read in conjunction with the accompanying drawings.

BRIEF DESCRIPTION OF THE DRAWINGS

FIGS. 4A through 4D are illustrative drawings showing examples of data tables;

FIG. 6 is a table chart showing simulation results and measured results;

FIG. 9 is a flowchart of a process of extracting parameters by using the integrated simulation device of FIG. 8.

DETAILED DESCRIPTION OF THE PREFERRED EMBODIMENTS

In the following, embodiments of the present invention will be described with reference to accompanying drawings.

Figure 2:
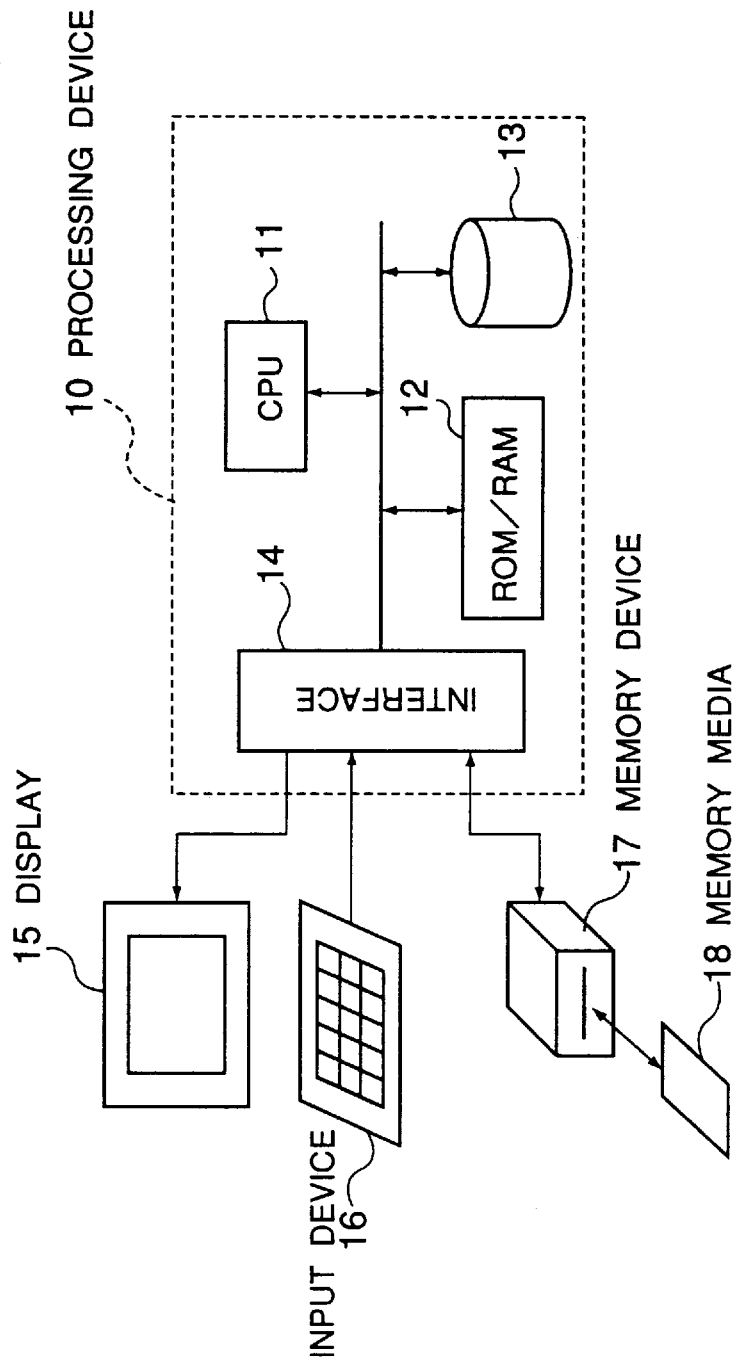
FIG. 2 is a block diagram of an integrated simulation device according to the present invention.

FIG. 2 is a block diagram of an integrated simulation device according to the present invention. The integrated simulation device of FIG. 2 is a general-purpose computer, and includes a processing device 10, a primary memory 12 such as RAM and ROM, a secondary memory 13 such as a hard drive, an interface 14, a display 15, a input device 16, and a memory device 17. A memory media 18 exchanges information with the processing device 10 upon insertion into the memory device 17.

The CPU 11 carries out data processing based on data and programs stored in the primary memory 12. These data and programs are transferred from the secondary memory 13 to the primary memory 12. Data obtained after the data processing is stored in secondary memory 13. The interface 14 provides interface with the display 15, the input device 16, and the memory device 17. The display 15 displays necessary information such as data and programs on a screen, and, also, is used for providing an interactive function along with the input device 16. The input device 16 receives inputs such as instructions, data, etc., from a user. The memory device 17 is used for reading/writing information from/in the memory media 18, which is provided in a form of a floppy disk, a CD-ROM, a ROM, or the like. The programs for the integrated simulation are provided in the memory media 18, and are transferred from the memory media 18 to the secondary memory 13 prior to the start of simulation.

The integrated simulation device of FIG. 2 is described merely for the purpose of showing an example of a basic configuration of an integrated simulation device of the present invention.

Figure 3:
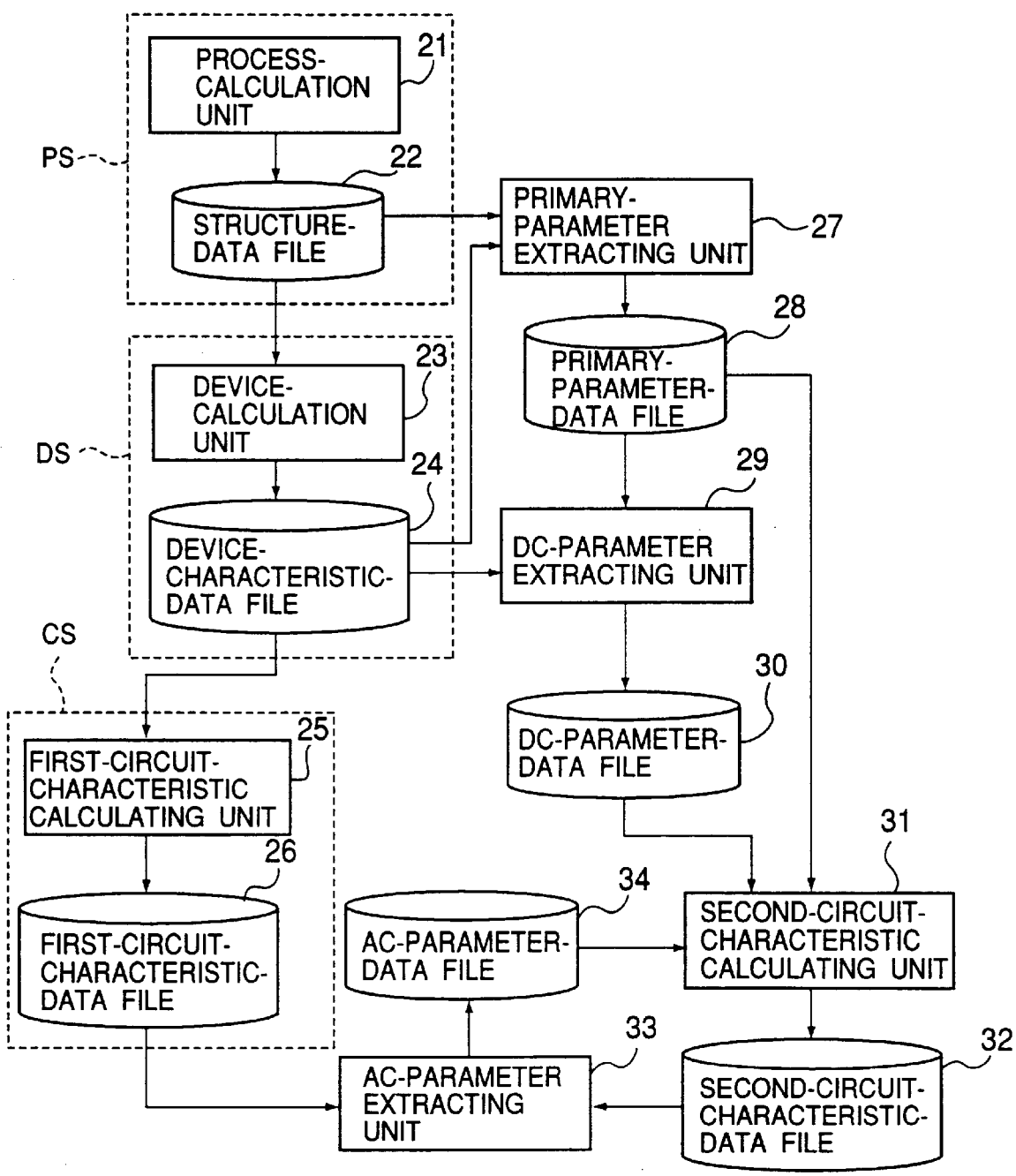
FIG. 3 is a block diagram of a first embodiment of an integrated simulation device according to the present invention.

FIG. 3 is a block diagram of a first embodiment of an integrated simulation device according to the present invention.

The integrated simulation device of FIG. 3 includes a process-calculation unit 21, a structure-data file 22, a device-calculation unit 23, a device-characteristic-data file 24, a first-circuit-characteristic calculating unit 25, a first-circuit-characteristic-data file 26, a primary-parameter extracting unit 27, a primary-parameter-data file 28, a DC-parameter extracting unit 29, a DC-parameter-data file 30, a second-circuit-characteristic calculating unit 31, a second-circuit-characteristic-data file 32, an AC-parameter extracting unit 33, and an AC-parameter-data file 34.

The process-calculation unit 21, which is a process simulator, calculates device structures of devices such as MOS transistors which are used as circuit components. The device structures thus obtained are stored in the structure-data file 22. The device-calculation unit 23, which is a device simulator, obtains device characteristics based on the device structures stored in the structure-data file 22. The device characteristics thus obtained are saved in the device-characteristic-data file 24. The device characteristics calculated by the device-calculation unit 23 include primary characteristics and DC characteristics of transistors.

The first-circuit-characteristic calculating unit 25, which is a circuit simulator, estimates AC-circuit characteristics based on the device characteristics stored in the device-characteristic-data file 24. The AC-circuit characteristics thus obtained are saved in the first-circuit-characteristic-data file 26. The AC-circuit characteristics of the first-circuit-characteristic-data file 26 are supplied to the AC-parameter extracting unit 33.

The process-calculation unit 21 and the structure-data file 22 serve as a process step PS. The process step PS is an actual process of producing the TEG in the prior art, but is a simulated process of calculating the device structures in the present invention. The device-calculation unit 23 and the device-characteristic-data file 24 serve as a device-measurement step DS, which is actual measurement of a produced device of the TEG in the prior art, but is a device simulation in the present invention. This device simulation calculates transistor DC characteristics based on material physics, and is well known in the art. The first-circuit-characteristic calculating unit 25 and the first-circuit-characteristic-data file 26 correspond to a circuit-measurement step CS. The circuit-measurement step CS is actual measurement of AC characteristics of the TEG sample circuit in the prior art, but is a circuit simulation in the present invention.

The primary-parameter extracting unit 27 extracts primary parameters from the data stored in the structure-data file 22 and the data stored in the device-characteristic-data file 24. Here, the primary parameters are one of the three parameter types used by the second-circuit-characteristic calculating unit 31. The extracted primary parameters are stored in the primary-parameter-data file 28.

Figure 1:
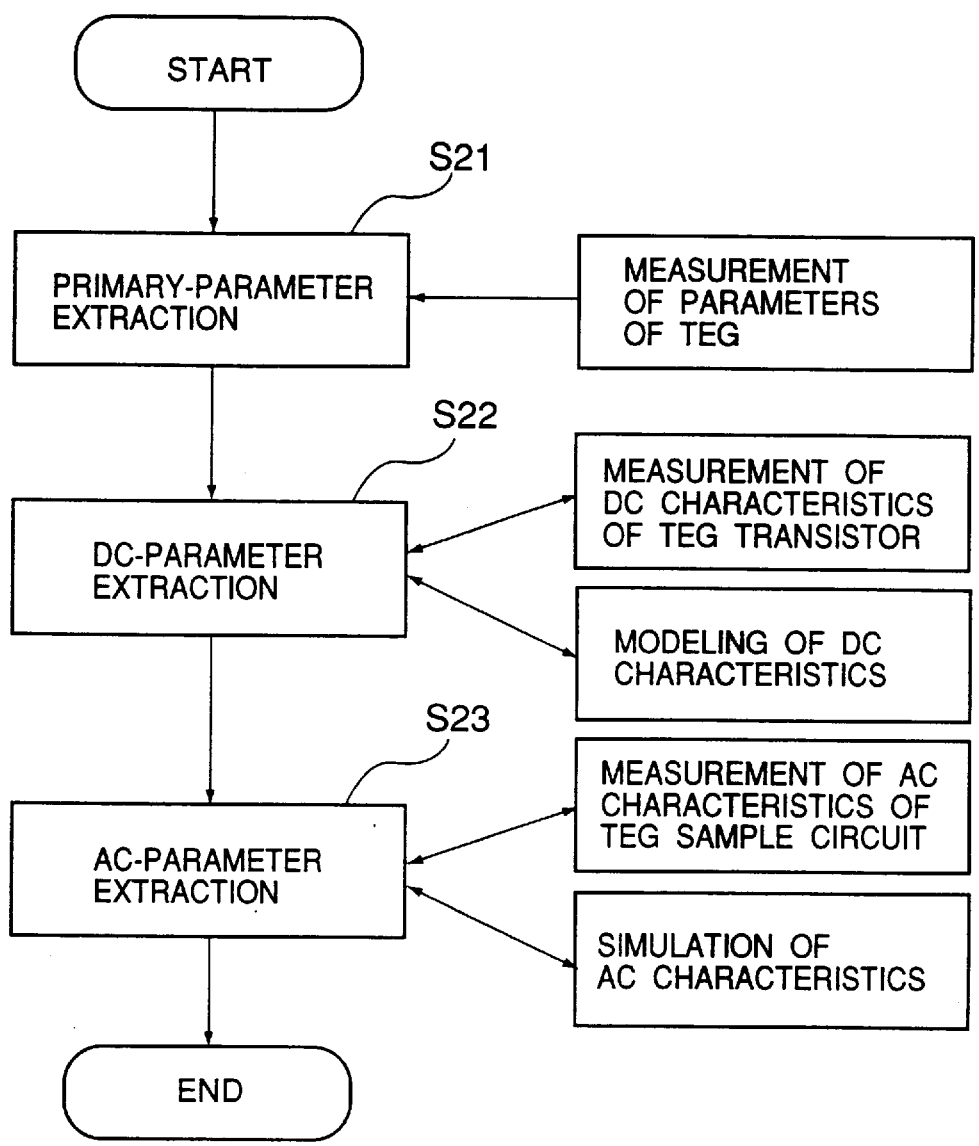
FIG. 1 is a flowchart of a parameter extraction method of the related art.

A function of the primary-parameter extracting unit 27 is the same as the step S21 of the prior art (FIG. 1), except that primary parameters are extracted from calculated devices rather than from actually produced devices.

The DC-parameter extracting unit 29 estimates DC parameters based on the transistor model using the primary parameters such that the simulated DC characteristics in the device-characteristic-data file 24 matches with the modeled DC characteristics. The DC parameters are stored in the DC-parameter-data file 30.

A function of the DC-parameter extracting unit 29 is the same as the step S22 of the prior art (FIG. 1), except that DC parameters are extracted based on comparison between the modeled DC characteristics and the simulated DC characteristics. In the prior art, a comparison between the modeled DC characteristics and the measured DC characteristics is made to obtain the DC parameters.

In the following, extraction of AC parameters will be explained.

In the prior art, AC parameters are obtained based on the DC parameters and the primary parameters such that the estimated AC circuit characteristics match with measured AC circuit characteristics. Instead of using the actual measurement, however, the present invention uses calculation results obtained by the first-circuit-characteristic calculating unit 25 as figures to be matched against.

The second-circuit-characteristic calculating unit 31 receives the primary parameters from the primary-parameter-data file 28, the DC parameters from the DC-parameter-data file 30, and default AC parameters from the AC-parameter-data file 34. The second-circuit-characteristic calculating unit 31, which is a circuit simulator, carries out a second circuit-characteristic calculation to obtain AC-circuit characteristics. The obtained AC-circuit characteristics are saved in the second-circuit-characteristic-data file 32. The AC-parameter extracting unit 33 compares the AC-circuit characteristics stored in the first-circuit-characteristic-data file 26 with the AC-circuit characteristics stored in the second-circuit-characteristic-data file 32. If these AC-circuit characteristics are different, the AC-parameter extracting unit 33 generates new AC parameters and store them in the AC-parameter-data file 34. Then, the second-circuit-characteristic calculating unit 31 carries out the second circuit-characteristic calculation again by using the new AC parameters, and the AC-parameter extracting unit 33 makes the comparison again. These calculations are repeated until the calculation results of the first-circuit-characteristic calculating unit 25 become equal to the calculation results of the second-circuit-characteristic calculating unit 31.

In the following, the reason why the calculation results of the first-circuit-characteristic calculating unit 25 can be used in place of the actual measurements will be described. In order to use the calculation results in place of the actual measurements, the first-circuit-characteristic calculating unit 25 must have sufficient accuracy. Prior to the calculation of the AC-circuit characteristics, the first-circuit-characteristic calculating unit 25 first generates data tables based on the device-characteristic data stored in the device-characteristic-data file 24.

FIGS. 4A through 4D are illustrative drawings showing examples of the data tables. FIG. 4A shows a data table which contains relationships between a drain current $I_{DS}$ and various bias voltages, i.e., a drain bias $V_{DS}$, a gate bias $V_{GS}$, and a bulk bias $V_{BS}$. This data table is looked up in order to obtain a characteristic curves of FIG. 5B correspond to a plurality of different drain biases $V_{DS}$. Characteristic data of FIG. 5B is contained in the data tables of FIGS. 4B through 4C.

Figure 5A:
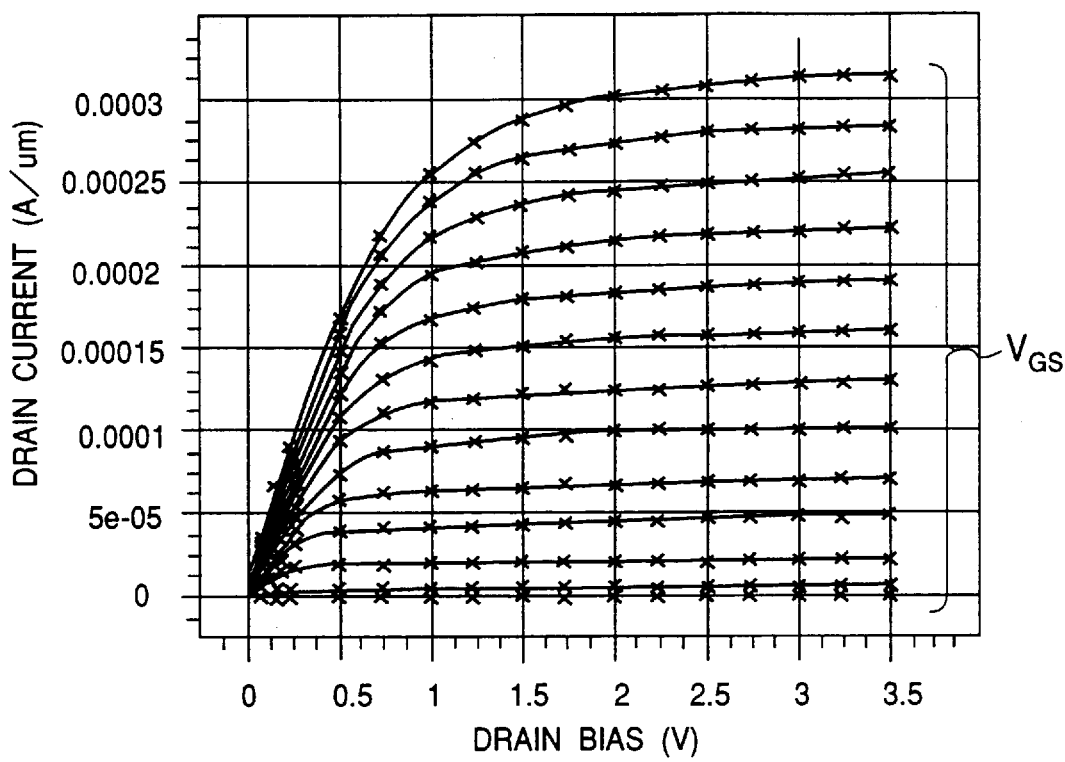
FIG. 5A is a chart showing an example of calculated current-voltage characteristics.
Figure 5B:
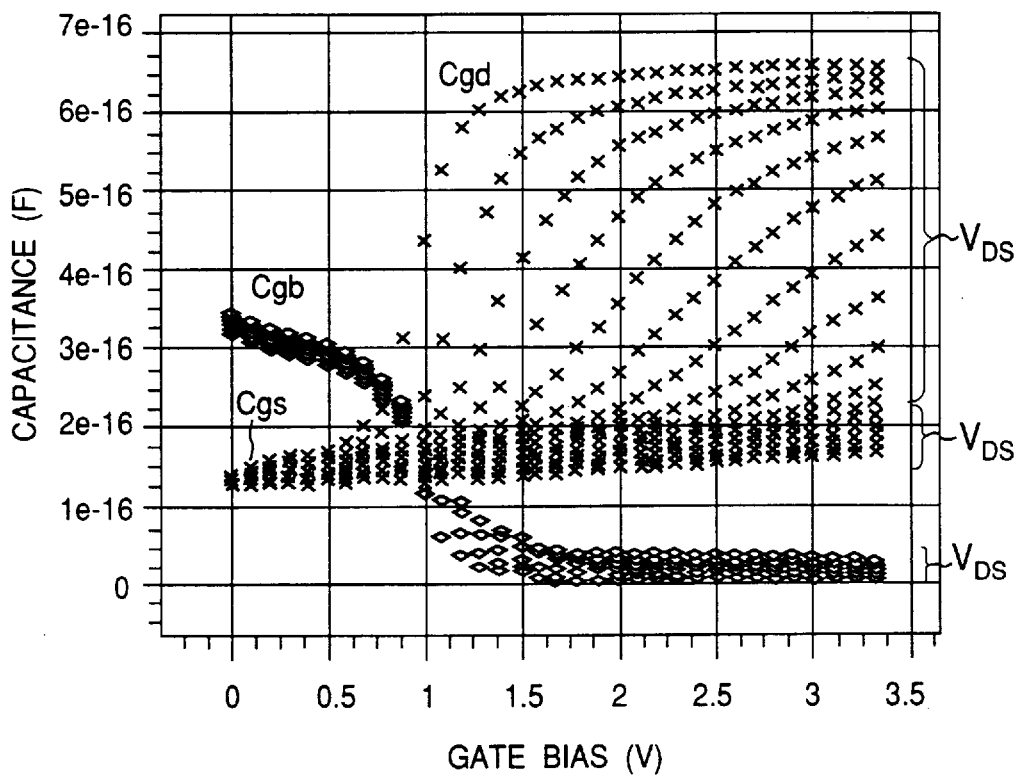
FIG. 5B is a chart showing an example of calculated capacitance-voltage characteristics.

Characteristics data of FIGS. 5A and 5B is obtained by the device simulation based on material physics, and, thus, has satisfactory accuracy.

The first-circuit-characteristic calculating unit 25 carries out a simulation calculation of a sample circuit such as a ring oscillator, and obtains AC characteristics of the sample circuit. In doing so, the first-circuit-characteristic calculating unit 25 uses accurate characteristic data of the data tables. FIG. 6 is a table chart showing simulation results and measured results. In FIG. 6, a propagation delay time Tpd of the ring oscillator and a saturated drain current Idsat of the transistor that composes the ring oscillator are shown for both the data-table-based simulation and the TEG-based actual measurement. As shown in FIG. 6, good agreement can be obtained between the simulation results and the measured results, indicating an appropriateness of the use of the data tables.

It should be noted that the second-circuit-characteristic calculating unit 31 carries out a drain current $I_{DS}$ when a drain bias $V_{DS}$, a gate bias $V_{GS}$, and a bulk bias $V_{BS}$ are provided.

To be exact, other factors are incorporated in the data tables. These factors include gate length L and channel width W of the transistors, which are omitted from FIG. 4A for the sake of simplicity of the figure and explanation.

FIG. 4B shows another data table which shows relationships between a gate-source capacitance $C_{gs}$ and both a gate bias $V_{GS}$ and a drain bias $V_{DS}$. Looking up this data table, a gate-source capacitance $C_{gs}$ is obtained when a gate bias $V_{GS}$ and a drain bias $V_{DS}$ are provided. FIGS. 4C and 4D show similar data tables for the gate-bulk capacitance $C_{gb}$ and for the gate-drain capacitance $C_{gd}$, respectively.

FIG. 5A is a chart showing an example of calculated current-voltage characteristics between the drain current $I_{DS}$ and the drain bias $V_{DS}$, the gate bias $V_{GS}$, and the bulk bias $V_{BS}$. FIG. 5A shows a case in which the bulk bias $V_{BS}$ is zero. A plurality of characteristic curves correspond to a plurality of different gate biases $V_{GS}$. Characteristic data of FIG. 5A corresponds to the data table of FIG. 4A. FIG. 5B is a chart showing an example of calculated capacitance-voltage characteristics. A plurality of simulation of the sample circuit by using the default (or updated) AC parameters and the analytic model expressing DC characteristics based on the DC parameters. On the other hand, the first-circuit-characteristic calculating unit 25 conducts the simulation by using the data tables which contain accurate DC characteristics (FIG. 5A) and precise AC characteristics (FIG. 5B). Because of the use of the default AC parameters and incompleteness of the analytic model, the initial simulation results are inevitably different between the second-circuit-characteristic calculating unit 31 and the first-circuit-characteristic calculating unit 25. When the simulation results are matched, AC parameters factoring in the incompleteness of the analytic model can be obtained.

In this manner, the present invention provides all the necessary parameters, i.e., the primary parameters, DC parameters, and AC parameters. The obtained AC parameters are stored in the AC-parameter-data file 34 to be used in subsequent simulations of designed circuits. These subsequent circuit simulations are conducted based on analytic models using those parameters, so that the circuit simulations can be flexibly applied to various circuit designs and large-scale circuits.

Figure 7:
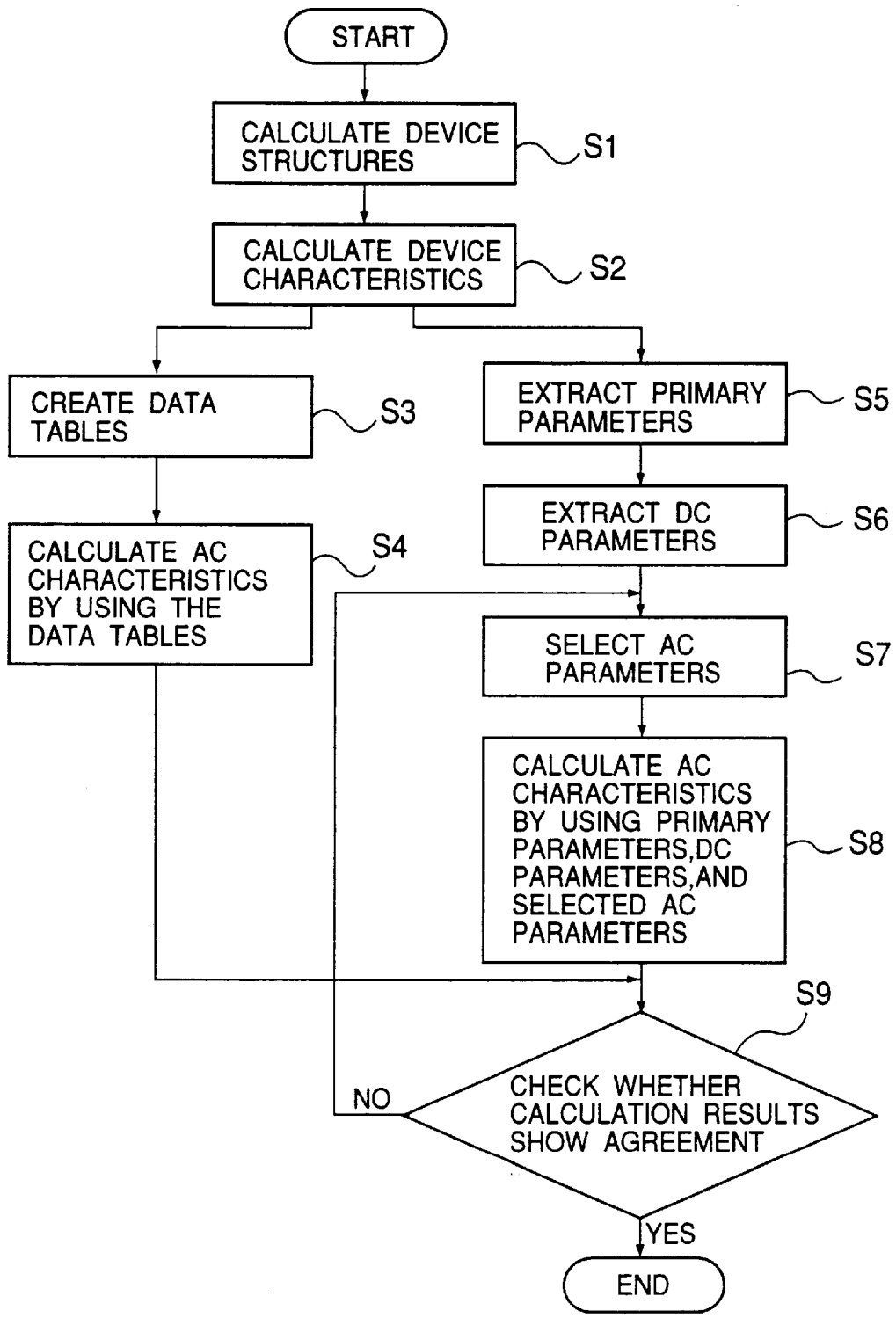
FIG. 7 is a flowchart of a process of extracting parameters by using the integrated simulation device of FIG. 3.

FIG. 7 is a flowchart of a process of extracting parameters by using the integrated simulation device of FIG. 3.

In the following, a method of extracting circuit parameters by using the integrated simulation device of FIG. 3 will be described with reference to FIG. 7.

At a step S1, the process-calculation unit 21 calculates the structures of circuit-component devices such as MOS transistors which make up a circuit, and the structure data thus obtained is stored in the structure-data file 22.

At a step S2, the device-calculation unit 23 calculates the device characteristics based on the structure data, and the device characteristics are saved in the device-characteristic-data file 24.

At this point, the process flow is divided into two flows, one leading up to the calculation by the first-circuit-characteristic calculating unit 25 and the other leading up to the calculation by the second-circuit-characteristic calculating unit 31.

First, a procedure for obtaining the AC characteristics by the first-circuit-characteristic calculating unit 25 will be described.

At a step S3, the data tables are created for use by the first-circuit-characteristic calculating unit 25 based on the characteristics data stored in the device-characteristic-data file 24.

At a step S4, the first-circuit-characteristic calculating unit 25 calculates AC characteristics of a sample circuit such as a ring oscillator by using the data tables, and the obtained AC characteristics are stored in the first-circuit-characteristic-data file 26.

Next, a procedure of the other flow will be described.

At a step S5, the primary-parameter extracting unit 27 extracts the primary parameters from the data stored in the structure-data file 22 and the device-characteristic-data file 24. The extracted primary parameters are stored in the primary-parameter-data file 28.

At a step S6, the DC-parameter extracting unit 29 extracts the DC parameters such that the DC characteristics modeled based on primary parameters show good agreement with the DC characteristics stored in the device-characteristic-data file 24, and the obtained DC parameters are saved in the DC-parameter-data file 30.

As previously described, the prior art obtains the AC parameters which provide matching between the measured AC circuit characteristics and the simulated AC circuit characteristics based on the primary parameters and the DC parameters. In the present invention, the calculated AC-circuit characteristics obtained by the first-circuit-characteristic calculating unit 25 are used as counterparts to be matched against the simulated AC-circuit characteristics obtained by the second-circuit-characteristic calculating unit 31.

At a step S7, AC parameters are selected from the AC-parameter-data file 34. Initially, default AC parameters are selected based on the primary parameters and the DC parameters.

At a step S8, the second-circuit-characteristic calculating unit 31 calculates the AC-circuit characteristics of the sample circuit by using the primary parameters, the DC parameters, and the selected AC parameters.

At a step S9, the AC-parameter extracting unit 33 checks whether the calculation results show agreement between the first-circuit-characteristic calculating unit 25 and the second-circuit-characteristic calculating unit 31, and, then, obtains new AC parameters. If the calculation results are the same, the procedure ends. If these calculation results are different, the procedure goes back to the step S7 to repeat the steps S7 through S9 with the new AC parameters until the calculation results show a satisfactory match between the first-circuit-characteristic calculating unit 25 and the second-circuit-characteristic calculating unit 31.

In this manner, the primary parameters, the DC parameters, and the AC parameters are extracted according to a parameter-extraction method of the present invention.

In the following, a second embodiment of the present invention will be described.

Figure 8:
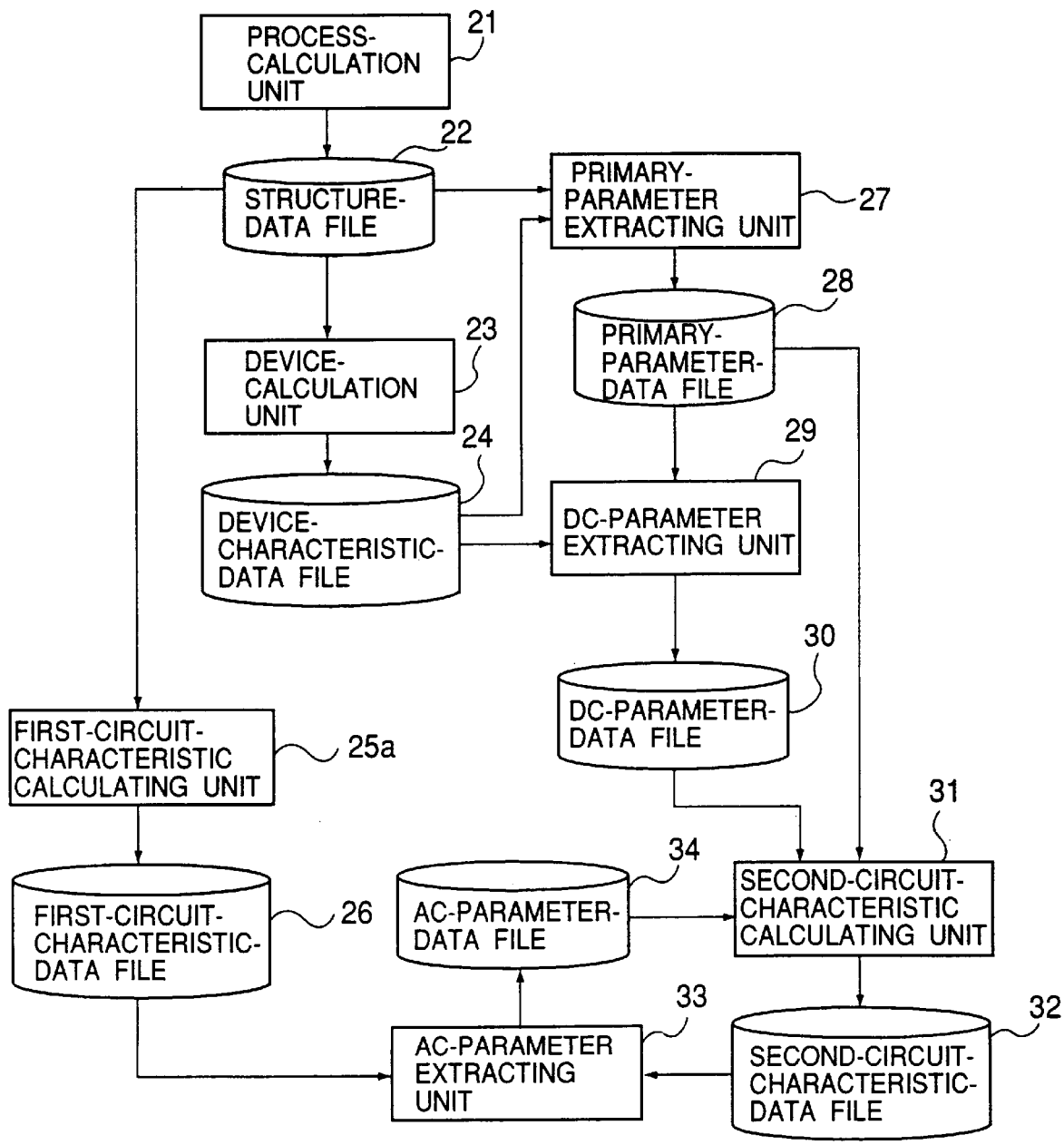
FIG. 8 is a block diagram of a second embodiment of an integrated simulation device according to the present invention.

FIG. 8 is a block diagram of a second embodiment of an integrated simulation device according to the present invention.

In the first embodiment described above, the first-circuit-characteristic calculating unit 25 has such a configuration that it looks up the data tables to calculate the AC characteristics. In the second embodiment, however, a first-circuitcharacteristic calculating unit does not use the data tables, but is provided with additional functions of calculating device characteristics to obtain voltage-current relationships and voltage-capacitance relationships as they become necessary.

In FIG. 8, a first-circuit-characteristic calculating unit 25a is provided in place of the first-circuit-characteristic calculating unit 25 of FIG. 3, and receives the device structures for the device simulation from the structure-data file 22. The first-circuit-characteristic calculating unit 25a is equipped with a device simulator using a drift-diffusion model and the SPICE circuit simulator. When the SPICE circuit simulator estimates AC characteristics of a sample circuit, the device simulator calculates necessary voltage-current characteristics and voltage-capacitance characteristics of circuit components (MOS transistors), and supplies these characteristics to the SPICE circuit simulator. The AC characteristics of the sample circuits are stored in the first-circuit-characteristic-data file 26.

In the second embodiment, the device simulator of the first-circuit-characteristic calculating unit 25a calculates only necessary figures of the data tables of the first embodiment as these figures becomes necessary. Thus, there is no need to calculate and prepare the data tables in advance, yet accurate characteristics are obtained as in the first embodiment.

A configuration and an operation of the integrated simulation device of FIG. 8 are the same as those of FIG. 3, except for the first-circuit-characteristic calculating unit 25a. Thus, a further description of the configuration and operation of FIG. 8 will be omitted.

FIG. 9 is a flowchart of a process of extracting parameters by using the integrated simulation device of FIG. 8.

In the following, a method of extracting circuit parameters by using the integrated simulation device of FIG. 8 will be described with reference to FIG. 9.

At a step S11, the process-calculation unit 21 calculates the structures of circuit-component devices such as MOS transistors which make up a circuit, and the structure data thus obtained is stored in the structure-data file 22.

The second embodiment has two flows after this point. One leads up to the calculation by the first-circuit-characteristic calculating unit 25a, and the other leads up to the calculation by the second-circuit-characteristic calculating unit 31.

First, a procedure for obtaining the AC characteristics by the first-circuit-characteristic calculating unit 25a will be described.

At a step S12, the first-circuit-characteristic calculating unit 25a receives the device structures for the device simulation from the structure-data file 22, and calculates AC characteristics of a sample circuit by using the drift-diffusion-model device simulator and the SPICE circuit simulator. The obtained AC characteristics are stored in the first-circuit-characteristic-data file 26.

Next, a procedure of the other flow will be described.

At a step S13, the device-calculation unit 23 calculates the device characteristics based on the structure data, and the device characteristics are saved in the device-characteristic-data file 24.

At a step S14, the primary-parameter extracting unit 27 extracts the primary parameters from the data stored in the structure-data file 22 and the device-characteristic-data file 24. The extracted primary parameters are stored in the primary-parameter-data file 28.

At a step S15, the DC-parameter extracting unit 29 extracts the DC parameters such that the DC characteristics modeled based on primary parameters show good agreement with the DC characteristics stored in the device-characteristic-data file 24, and the obtained DC parameters are saved in the DC-parameter-data file 30.

In the present invention, the calculated AC circuit characteristics obtained by the first-circuit-characteristic calculating unit 25a are used as counterparts to be matched against the simulated AC circuit characteristics obtained by the second-circuit-characteristic calculating unit 31.

At a step S16, AC parameters are selected from the AC-parameter-data file 34. Initially, default AC parameters are selected based on the primary parameters and the DC parameters.

At a step S17, the second-circuit-characteristic calculating unit 31 calculates the AC characteristics of the sample circuit by using the primary parameters, the DC parameters, and the selected AC parameters.

At a step S18, the AC-parameter extracting unit 33 checks whether the calculation results show agreement between the first-circuit-characteristic calculating unit 25a and the second-circuit-characteristic calculating unit 31, and, then, obtains new AC parameters. If the calculation results are the same, the procedure ends. If these calculation results are different, the procedure goes back to the step S16 to repeat the steps S16 through S18 with the new AC parameters until the calculation results show a satisfactory match between the first-circuit-characteristic calculating unit 25a and the second-circuit-characteristic calculating unit 31.

In this manner, the primary parameters, the DC parameters, and the AC parameters are extracted according to a parameter-extraction method of the second embodiment of the present invention.

Further, the present invention is not limited to these embodiments, but various variations and modifications may be made without departing from the scope of the present invention.

What is claimed is:

1. A device for conducting circuit simulations comprising:

a process simulator that simulates the formation process of circuit component devices and determines device structure characteristics of said circuit component devices;

a device simulator that simulates the operation of said circuit component devices and determines device operating characteristics of said circuit component devices based on said device structure characteristics;

a first circuit simulator that simulates the operation of said circuit component devices operating as a sample circuit and determines first dynamic characteristics of said sample circuit based on said device operating characteristics;

a second circuit simulator that simulates the operation of said circuit component devices operating as said sample circuit and determines second dynamic characteristics of said sample circuit based on first parameters and second parameters; and a parameter extracting unit that extracts said first parameters based on said device structure characteristics and said device operating characteristics, and that determines said second parameters based on a comparison of said first dynamic characteristics and said second dynamic characteristics;

wherein said second circuit simulator performs said simulation based on said first parameters and said second parameters.

2. The device as claimed in claim 1, wherein said parameter extracting unit comprises:
a primary parameter extracting unit that extracts primary parameters as said first parameters directly from said device structure characteristics and said device operating characteristics;
a static parameter extracting unit that determines static parameters as said first parameters based on a comparison of static characteristics of modeled circuit component devices based on said primary parameters and simulated static parameters; and
a dynamic parameter extracting unit that determines dynamic parameters as said second parameters, said dynamic parameters being based on a comparison of said first dynamic characteristics and said second dynamic characteristics.

3. The device as claimed in claim 2 wherein said static parameters comprise D.C. parameters.

4. The device as claimed in claim 2, wherein said dynamic parameters comprise A.C. parameters.

5. The device as claimed in claim 1, wherein said first circuit simulator includes data tables of said device operating characteristics, and said first circuit simulator calculates said first dynamic characteristics based on said data tables.

6. The device as claimed in claim 1, wherein said first circuit simulator calculates said first dynamic characteristics based on device operating characteristics by generating said device operating characteristics during said calculation of said first dynamic characteristics.

7. The device as claimed in claim 1, wherein said second circuit simulator conducts said sample circuit simulation using analytic models of said circuit component devices.

8. A method for conducting circuit simulations comprising;
determining device structure characteristics of circuit component devices;
determining device operating characteristics of said circuit component devices based on said device structure characteristics;
determining first dynamic characteristics of said circuit component devices operating as a sample circuit based on said device operating characteristics;
extracting first parameters based on said device structure characteristics and said device operating characteristics;
extracting second parameters;
determining second dynamic characteristics of said circuit component devices operating as said sample circuit based on said first parameters and said second parameters; and
comparing said first dynamic characteristics and said second dynamic characteristics and adjusting said second parameters until said first dynamic characteristics and said second dynamic characteristics are substantially matched.

9. The method as claimed in claim 8, wherein said first parameters comprise primary and static parameters and wherein said primary parameters are extracted directly from said device structure characteristics and said device operating characteristics, and
wherein said static parameters are determined based on a comparison of static characteristics of modeled circuit component devices based on said primary parameters and simulated static characteristics.

10. The method as claimed in claim 9, wherein said static parameters comprise D.C. parameters.

11. The method as claimed in claim 8, wherein said step of determining said first dynamic characteristics comprises:
creating at least one data table of said device operating characteristics for said circuit component devices; and
calculating said first dynamic characteristics based on said at least one data table.

12. The method as claimed in claim 11, wherein said dynamic parameters comprise A.C. parameters.

13. The method as claimed in claim 8, wherein said step of determining said first dynamic characteristics comprises, simulating operation of said sample circuit and calculating said first dynamic characteristics based on device operating characteristics generated during said simulation.

14. The method as claimed in claim 8, wherein said second dynamic characteristics are determined using analytic models of said circuit component devices.

15. A computer program product for conducting circuit simulations, said computer program product comprising:
a computer readable medium providing program code means for conducting said circuit simulations, said program code means comprising:
process simulator means for causing a computer to simulate the formation process of circuit component devices and determine device structure characteristics of said circuit component characteristics;
device simulator means for causing said computer to simulate the operation of said circuit component devices and determine device operating characteristics of said circuit component devices based on said device structure characteristics;
first circuit simulator means for causing said computer to simulate the operation of said circuit component devices operating as a sample circuit and determine first dynamic characteristics of said sample circuit based on said device operating characteristics;
second circuit simulator means for causing said computer to simulate the operation of said circuit component devices operating as said sample circuit and determine second dynamic characteristics of said sample circuit based on first parameters and second parameters; and
parameter extracting means for causing said computer to extract said first parameters based on said device structure characteristics and said device operating characteristics, and to determine said second parameters based on a comparison of said first dynamic characteristics and said second dynamic characteristics;
wherein said second circuit simulator means causes said computer to conduct said circuit simulation of said sample circuit based on said first parameters and said second parameters.

16. The computer program product as claimed in claim 15, wherein said parameter extracting means comprises:
primary parameter extracting means for causing said computer to extract primary parameters as said first parameters directly from said device structure characteristics and said device operating characteristics;
static parameter extracting means for causing said computer to determine static parameters as said first parameters based on a comparison of static characteristics of modeled circuit component devices based on said primary parameters and simulated static parameters; and
dynamic parameter extracting means for causing said computer to determine dynamic parameters as said second parameters, said dynamic parameters being based on a comparison of said first dynamic characteristics and said second dynamic characteristics.

17. The computer program product as claimed in claim 16, wherein said static parameters comprise D.C. parameters.

18. The computer program product as claimed in claim 16, wherein said dynamic parameters comprise A.C. parameters.

19. The computer program product as claimed in claim 15, wherein said first circuit simulator means causes said computer to create date tables of said device operating characteristics, and to calculate said first dynamic characteristics based on said data tables.

20. The computer program product as claimed in claim 15, wherein said first circuit simulator means causes said computer to calculate said first dynamic characteristics based on device operating characteristics by generating said device operating characteristics during said calculation of said first dynamic characteristics.

21. The computer program product as claimed in claim 15, wherein said second circuit simulator means causes said computer to conduct said sample circuit simulation using analytic models of said circuit component devices.

22. A device for conducting circuit simulations comprising:
    process simulator means for simulating the formation process of circuit component devices and for determining device structure characteristics of said circuit component devices;
    device simulator means for simulating the operation of said circuit component devices and determining device operating characteristics of said circuit component devices based on said device structure characteristics;
    first circuit simulator means for simulating the operation of said circuit component devices operating as a sample circuit and for determining first dynamic characteristics of said sample circuit based on said device operating characteristics;
    second circuit simulator means for simulating the operation of said circuit component devices operating as said sample circuit and for determining second dynamic characteristics of said sample circuit based on first parameters and second parameters; and
    parameter extracting means for extracting said first parameters based on said device structure characteristics and said device operating characteristics, and for determining said second parameters based on a comparison of said first dynamic characteristics and said second dynamic characteristics;
    wherein said second circuit simulator means performs said simulation based on said first parameters and said second parameters.

23. The device as claimed in claim 22, wherein said parameter extracting means comprises:
    primary parameter extracting means for extracting primary parameters as said first parameters directly from said device structure characteristics and said device operating characteristics;
    a static parameter extracting means for determining static parameters as said first parameters based on a comparison of static characteristics of modeled circuit component devices based on said primary parameters and simulated static parameters; and
    a dynamic parameter extracting means for determining dynamic parameters as said second parameters, said dynamic parameters being based on a comparison of said first dynamic characteristics and said second dynamic characteristics.

24. The device as claimed in claim 23, wherein said static parameters comprise D.C. parameters.

25. The device as claimed in claim 23, wherein said dynamic parameters comprise A.C. parameters.

26. The device as claimed in claim 22, wherein said first circuit simulator means includes data tables of said device operating characteristics, and wherein said first circuit simulator means calculates said first dynamic characteristics based on said data tables.

27. The device as claimed in claim 22, wherein said first circuit simulator means calculates said first dynamic characteristics based on device operating characteristics by generating said device operating characteristics during said calculation of said first dynamic characteristics.

28. The device as claimed in claim 22, wherein said second circuit simulator means conducts said sample circuit simulation using analytic models of said circuit component devices.

* * * * *